US006548575B2

(12) United States Patent
Carpenter et al.

(10) Patent No.: US 6,548,575 B2
(45) Date of Patent: Apr. 15, 2003

(54) HIGH TEMPERATURE UNDERFILLING MATERIAL WITH LOW EXOTHERM DURING USE

(75) Inventors: Neil M. Carpenter, Zaventem (BE); Michel Ruyters, Tessenderlo (BE)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 09/735,821

(22) Filed: Dec. 13, 2000

(65) Prior Publication Data

US 2002/0106515 A1 Aug. 8, 2002

(51) Int. Cl.$^7$ ............................................... C08L 63/00
(52) U.S. Cl. ......................... 523/400; 528/87; 528/88; 528/93; 528/103; 528/112; 528/117; 528/119
(58) Field of Search ........................... 528/87, 88, 93, 528/103, 112, 117, 119; 428/414

(56) References Cited

U.S. PATENT DOCUMENTS

| 5,444,127 A | * | 8/1995 | Miskel et al. ............... 525/504 |
| 5,512,613 A | * | 4/1996 | Afzali-Ardakani et al. |
| 5,541,000 A | * | 7/1996 | Hardy et al. |
| 5,953,814 A | | 9/1999 | Sozansky et al. |
| 6,057,402 A | | 5/2000 | Zhou et al. |
| 6,060,540 A | * | 5/2000 | Wanthal et al. |

FOREIGN PATENT DOCUMENTS

| EP | 1174481 A2 | * | 1/2002 | .......... C09J/163/00 |
| WO | WO98/37134 | | 2/1998 | |
| WO | WO99/05196 | | 7/1998 | |
| WO | WO99/67324 | | 6/1999 | |

OTHER PUBLICATIONS

"Latent Amine Adresses Needs for One–Package Epoxy Adhesive", Shah, D.N., Journal of the Adhesive and Sealant Council, Oct. 1997, pp. 271–284.*

* cited by examiner

*Primary Examiner*—Robert Dawson
*Assistant Examiner*—Marc S Zimmer
(74) *Attorney, Agent, or Firm*—Charles W. Almer

(57) ABSTRACT

A curable underfill composition comprising an epoxy containing a curing agent component and a latent accelerator component. The accelerator component comprises a material which produces a resin with an exotherm below 300 J/g. Further, the combination may be utilized in an unfilled state which allows the epoxy to remain very viscous and thus increases the speed of the underfill process in comparison to filled epoxy compositions and epoxy compositions containing different accelerator components.

13 Claims, No Drawings

HIGH TEMPERATURE UNDERFILLING MATERIAL WITH LOW EXOTHERM DURING USE

FIELD OF THE INVENTION

This invention relates to a composition for underfill encapsulation comprising a one component epoxy-based product.

BACKGROUND OF THE INVENTION

This invention relates to underfill encapsulant compositions prepared from epoxies to protect and reinforce the interconnections between an electronic component and a substrate in a microelectronic device. Microelectronic devices contain millions of electrical circuit components, mainly transistors assembled in integrated circuit (IC) chips, but also resistors, capacitors, and other components. These electronic components are interconnected to form the circuits, and eventually are connected to and supported on a carrier or substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board.

Whether the component is a bare chip connected to a lead frame, or a package connected to a printed wire board or other substrate, the connections are made between electrical terminations on the electronic component and corresponding electrical terminations on the substrate. One method for making these connections uses metallic or polymeric material that is applied in bumps to the component or substrate terminals. The terminals are aligned and contacted together and the resulting assembly heated to reflow the metallic or polymeric material and solidify the connection.

During subsequent manufacturing steps, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent failure, the gap between the component and the substrate is filled with a polymeric encapsulant, hereinafter called underfill or underfill encapsulant, to reinforce the interconnect material and to absorb some of the stress of the thermal cycling.

Two prominent uses for underfill technology are in packages known in the industry as CSP (chip scale packages), in which a chip package is attached to a printed wire board, and flip-chip ball grid array in which a chip is attached by a ball and grid array to a printed wire board.

The underfill encapsulation may take place after the reflow of the metallic or polymeric interconnect, or it may take place simultaneously with the reflow. If underfill encapsulation takes place after reflow of the interconnect, a measured amount of underfill encapsulant material will be dispensed along one or more peripheral sides of the electronic assembly and capillary action within the component-to-substrate gap draws the material inward. The substrate may be preheated if needed to achieve the desired level of encapsulant viscosity for the optimum capillary action. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

If underfill encapsulation is to take place simultaneously with reflow of the solder or polymeric interconnects, the underfill encapsulant, which can include a fluxing agent if solder is the interconnect material, first is applied to either the substrate or the component; then terminals on the component and substrate are aligned and contacted and the assembly heated to reflow the metallic or polymeric interconnect material. During this heating process, curing of the underfill encapsulant occurs simultaneously with reflow of the metallic or polymeric interconnect material.

For single chip packaging involving high volume commodity products, a failed chip can be discarded without significant loss. However, it becomes expensive to discard multi-chip packages with only one failed chip and the ability to rework the failed component would be a manufacturing advantage. Today, one of the primary thrusts within the semiconductor industry is to develop not only an underfill encapsulant that will meet all the requirements for reinforcement of the interconnect, but also an underfill encapsulant that will be reworkable, allowing for the failed component to be removed without destroying the substrate.

Conventional underfill technology uses materials which, in an unfilled state, have high exothermic reactions, typically in the range of 350–400 J/gram. Materials having an exotherm of greater than 300 J/g are not allowed to be shipped via air and require special refrigerated shipping via road freight. These materials also require special handling by end users. Consequently, fillers such as silica or other minerals are often added to the materials in order to reduce the exotherm and increase the ease of use and shipping. Fillers, while reducing the exotherm, produce a more viscous underfill which requires a longer fill time. Therefore, there is a need for new unfilled underfill encapsulant compositions that have a low exotherm.

SUMMARY OF THE INVENTION

This invention relates to a curable underfill composition comprising an epoxy containing a solid latent hardening agent component and a latent accelerator component. The accelerator component comprises a material which produces a resin with an exotherm below 300 J/g. Further, the combination may be utilized in an unfilled state which allows the epoxy to remain very fluid and thus increases the speed of the underfill process in comparison to filled epoxy compositions and epoxy compositions containing different accelerator components.

DETAILED DESCRIPTION OF THE INVENTION

The resins used in the underfill encapsulation composition and process of the present invention are curable compounds, which means that they are capable of polymerization with or without cross-linking. As used in this specification, to cure will mean to polymerize, with or without cross-linking. Cross-linking, as understood in the art, is the attachment of two polymer chains by bridges of an element, a molecular group, or a compound, and in general takes place upon heating.

The ingredients of the present invention include epoxy resins, epoxy diluents, a solid latent hardening or curing agent and a latent accelerator component. In a preferred formulation, the composition of the present invention comprises in the range of about 10 to 90 weight percent resin, in the range of about 5 to 20 weight percent reactive diluent, in the range of about 1 to 25 weight percent curing agent, in the range of about 1 to 10 weight percent accelerator agent and in the range of about 80 weight percent filler. These ingredients are specifically chosen to obtain the desired balance of properties for the use of the particular resin. For example, for some underfill processes it is desirable to obtain a resin composition which will be low in viscosity resulting in a short underfill period and a short curing time period. It is known in the art to provide an amine or imidazole hardening agent in combination with the resin and the accelerator. It is also known in the art that a filler material, such as silica or another mineral, may be provided.

Examples of epoxy resins suitable for use in the present underfill include monofunctional and multifunctional resins or a combination thereof, from the bisphenol A type, bisphenol F type, epoxy phenol novalac type or the epoxy cresol novalac type. Other suitable epoxy compounds include polyepoxy compounds based on aromatic amines and epichlorohydrin. The preferred epoxy resin is bisphenol A/F.

The use of a filler material generally reduces the exotherm of the composition while also reducing the viscosity of the composition. Thus resin compositions containing one or more filler materials are more viscous than unfilled compositions and thus require longer periods of time to complete the underfill process than unfilled compositions. Suitable fillers for use are inert mineral substances such as silica, mica, alumina and the like. Examples of suitable latent hardeners are dicyanidiamide, blocked imidazoles and blocked polyamides, with dicyanidiamide being the most preferred. Examples of suitable accelerators are imidazoles, substituted ureas and the like. While common reactive diluents may be employed, a preferred reactive diluent is p-tert butyl phenylglycidylether.

The choice of the resin accelerator component is especially critical in that known accelerator components such as imidazoles or substituted ureas produce a resin which in its unfilled state has a very high exotherm, i.e., an exotherm which is in the order of 350–400 J/g or greater. In order to produce a resin having a lower exotherm, a modified polyamine accelerator component having a high glass transition temperature is utilized. The preferred accelerator is a novel blocked amine with tertiary amine and urea moieties. This preferred accelerator is marketed under the tradename ANCAMINE 2441 and manufactured by Air Products Corporation, Allentown, Pa. The use of accelerators such as ANCAMINE 2441 produces a resin having an exotherm in the range of 200 J/g. Materials having an exotherm of greater than 300 J/g are prohibited from being shipped via air freight and require special handling by the end user. The reduction in the exotherm below 300 J/g provides the benefit of allowing for the resin to be transported by air freight and also provides for ease of handling by the end user. In contrast to known underfill compositions which may be utilized at temperatures as high as 80C., the low reaction exotherm with ANCAMINE 2441 allows effective use of the resin at temperatures in the range of about 120C. The higher temperature utilization of the resin allows the resin to be less viscous than at lower temperatures so that the resin flows more easily and quickly into the opening between the substrate and the electrical component which are to be bonded together to form the electronic assembly. The reduction in viscosity reduces the cycle time required for the underfill process from about 10 seconds to about 2–3 seconds. The invention may be better understood by reference to the following example.

EXAMPLE

Five known accelerators for the dicyanidiamide hardener were evaluated. The reaction exotherm was monitored for each formulation by means of a dynamic DSC experiment which involved ramping the temperature from 30C. to 250C. at a ramp rate of 10C./min. The time to fully cure the formulation onto a 160C. hotplate was also recorded. Further, the flow time was recorded by measuring the time needed to fill a gap or ca 190 um width over a length of 10 mm at both 80C. and 120C. The results of the evaluation are set forth in Table 1.

TABLE 1

| | Accelerator | | | | | | |
|---|---|---|---|---|---|---|---|
| | Ancamine 2441 (b) | Ancamine 2014 AS (b) | Ajicure PN-23 (c) | Ajicure MY-24 (c) | Diuron (d) | Blocked Imidazole | Blocked Imidazole |
| Sample | 1 | 2 | 3 | 4 | 5 | 6 | 7 |
| DEGBA (a) | 75.51 | 75.51 | 75.51 | 75.51 | 75.51 | 75.51 | 71.36 |
| Dicyandiamide | 2.67 | 2.67 | 2.67 | 2.67 | 2.67 | 2.67 | 2.67 |
| p-tert.-butylohenyl glycidylether | 17.50 | 17.50 | 17.50 | 17.50 | 17.50 | 17.50 | 17.50 |
| Accelerator | 4.00 | 4.00 | 4.00 | 4.00 | 4.00 | 4.00 | 4.00 |
| Enthalpy (J/g) | 209 | 177 | 307 | 183 | 217 | 320 | 418 |
| Stroke cure at 160° C. (min, sec) | 3'20" | 13' | 3' | >20' | 16' | 1' | 0'35" |
| Flow time (sec) | | | | | | | |
| at 80° C. | 5.8 | 6.3 | 6.4 | 5.9 | 7.9 | 6.2 | 8.3 |
| at 120° C. | 3.2 | 4.1 | 3.9 | 3.6 | 6.9 | 4.0 | 6.4 |

(a) Epikote ® 828 - Shell Chemicals
(b) Air Products & Chemicals, Inc.
(c) Ajinomoto Co., Inc.
(d) DuPont The results set forth in Table 1 clearly illustrate that the formulation which contains ANCAMINE 2441 provides an exotherm below 300 J/g and a stroke cure time of less than 5 minutes. The formulations with blocked imidazoles in similar proportions as the ANCAMINE 2441 of formulation 1 produce an exotherm greater than 300 J/g. In addition, the underfill formulation containing ANCAMINE 2441 provided the shortest underfill time of the formulations tested.

An additional benefit obtained via the utilization of a material such as ANCAMINE 2441 as an accelerator component is that the resulting underfill composition maintains stability at room temperature and may be stored at a temperature between 0–6° C. for at least 12 months. Typical known underfill compositions generally require storage in a freezer at a temperature between −18 and −40° C.

In a preferred embodiment of this invention, a pigment may be added to the composition. The addition of the pigment allows for automatic visual checking of products which may be accomplished by observing the color contrast between the board, the underfill and the chip. While pigments such as carbon black or organometallic complexes are often employed for contrast purposes, these pigments often produce undesirable grit or toxicity problems. A preferred pigment for use with the composition is a non-gritty red pigment and especially Sandorin Red BN pigment. This pigment produces an excellent color contrast between the board, the underfill and the chip and does not produce any grit or toxicity issues.

The present invention also provides a method for underfilling encapsulation wherein an electronic component, such as a chip, and a substrate, such as a board, are encapsulated by utilizing a resin having a polyamine accelerator component. The resin composition is prepared as a single component containing a resin, a curing component and an accelerator component having a high glass transition temperature. Prior to usage the resin is heated to a temperature of up to 120° C. When desired, a measured amount of the resin, usually about 50–200 mg. depending upon the size of the component, is placed between the substrate and the electrical component. The resin infiltrates the space between the substrate and the electrical component via capillary action. The resin is then allowed to cool with the result being a firm and stable connection between the substrate and the electrical component. While the invention has been described with particular reference to certain embodiments thereof, it will be understood that changes and modifications may be made by those of ordinary skill within the scope and spirit of the following claims.

What is claimed is:

1. A curable underfill composition comprising in the range of about 10 to about 90 weight percent resin, in the range of about 5 to 20 weight percent reactive diluent, in the range of about 1 to about to 25 weight percent curing agent, in the range of about 30 to 80 weight percent filler material and in the range of about 1 to 10 weight percent accelerator agent, wherein the composition has an exotherm of less than 300 J/g and wherein the accelerator agent comprises a blocked amine with tertiary amine and urea moieties.

2. A curable underfill composition according to claim 1, wherein the accelerator agent has an exotherm of less than 250 J/g.

3. A curable underfill composition according to claim 2, wherein the accelerator agent has an exotherm of less than 200 J/g.

4. A curable underfill composition according to claim 1, wherein the composition comprises in the range of about 70 to 75 weight percent epoxy resin, in the range of about 15 to 20 weight percent reactive diluent, in the range of about 2.5 to 4 weight percent curing agent and in the range of about 3 to 5 weight percent accelerator agent.

5. A curable underfill composition according to claim 4, wherein the resin is a monofunctional or multifunctional resin or a combination thereof.

6. A curable underfill composition according to claim 5, wherein the resin is a bisphenol A, bisphenol F, epoxy phenol novalac, cresol novalac, polyepoxy compound based on aromatic amines and epichlorohydrin, or mixtures thereof.

7. A curable underfill composition according to claim 6, wherein the resin is a mixture of bisphenol A and bisphenol F.

8. A curable underfill composition according to claim 1, wherein the filler is selected from the group consisting of silica, mica, alumina or mixtures thereof.

9. A curable underfill composition according to claim 1, wherein the curing agent is selected from the group consisting of dicyanidiamide, blocked imidazoles, blocked polyamides, or mixtures thereof.

10. A curable underfill composition according to claim 9, wherein the curing agent is dicyanidiamide.

11. A curable underfill composition according to claim 1, wherein the reactive diluent is p-tert butyl phenylglycidylether.

12. A curable underfill composition according to claim 1, wherein the composition further comprises a non-gritty pigment.

13. A curable underfill composition according to claim 12, wherein the non-gritty pigment is non-gritty red pigment.

* * * * *